United States Patent
Zhang et al.

(10) Patent No.: US 12,408,530 B2
(45) Date of Patent: Sep. 2, 2025

(54) DISPLAY PANEL, MANUFACTURING METHOD THEREFOR, AND DISPLAY APPARATUS

(71) Applicant: BOE Technology Group Co., Ltd., Beijing (CN)

(72) Inventors: Yongfeng Zhang, Beijing (CN); Rui Huang, Beijing (CN); Zhiwei Liang, Beijing (CN); Huajie Yan, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 634 days.

(21) Appl. No.: 17/762,688

(22) PCT Filed: May 7, 2021

(86) PCT No.: PCT/CN2021/092209
§ 371 (c)(1),
(2) Date: Mar. 22, 2022

(87) PCT Pub. No.: WO2022/007494
PCT Pub. Date: Jan. 13, 2022

(65) Prior Publication Data
US 2022/0416195 A1    Dec. 29, 2022

(30) Foreign Application Priority Data

Jul. 10, 2020 (CN) .......................... 202010660421.2

(51) Int. Cl.
*H01L 51/52* (2006.01)
*H01L 51/00* (2006.01)
(Continued)

(52) U.S. Cl.
CPC ............ *H10K 59/35* (2023.02); *H10K 30/865* (2023.02); *H10K 50/15* (2023.02); *H10K 50/16* (2023.02);
(Continued)

(58) Field of Classification Search
CPC ......... H10K 50/81–818; H10K 50/171; H10K 50/155; H10K 50/156; H10K 50/181;
(Continued)

(56) References Cited

U.S. PATENT DOCUMENTS

| 6,727,871 B1 | 4/2004 | Suzuki et al. |
| 2014/0027732 A1* | 1/2014 | Pyo .................... H10K 50/852 257/40 |

(Continued)

FOREIGN PATENT DOCUMENTS

| CN | 102738414 A | 10/2012 |
| CN | 109873012 A | 6/2019 |

(Continued)

OTHER PUBLICATIONS

CN202010660421.2 first office action.
CN202010660421.2 decision of rejection.

*Primary Examiner* — Steven B Gauthier
*Assistant Examiner* — Rhys Poniente Sheker
(74) *Attorney, Agent, or Firm* — IPro, PLLC

(57) ABSTRACT

Disclosed in embodiments of the present disclosure are a display panel, a manufacturing method therefor, and a display apparatus. The display panel includes a substrate, the substrate has a plurality of sub-pixel units; each sub-pixel unit includes at least two first electrodes which are independently arranged in the same layer; each first electrode includes at least two conductive layers which are arranged in a stacked manner; an edge of a top conductive layer that is away from the substrate exceeds an edge of a bottom (Continued)

conductive layer; the orthographic projection of the bottom conductive layer on the substrate falls within the range of the orthographic projection of the top conductive layer on the substrate; and a portion of the edge of the top conductive layer exceeding the edge of the bottom conductive layer extends towards one side of the substrate to constitute a sloping surface.

14 Claims, 13 Drawing Sheets

(51) Int. Cl.
| | |
|---|---|
| *H01L 51/50* | (2006.01) |
| *H01L 51/56* | (2006.01) |
| *H10K 30/80* | (2023.01) |
| *H10K 50/15* | (2023.01) |
| *H10K 50/16* | (2023.01) |
| *H10K 50/17* | (2023.01) |
| *H10K 50/813* | (2023.01) |
| *H10K 50/818* | (2023.01) |
| *H10K 50/844* | (2023.01) |
| *H10K 59/35* | (2023.01) |
| *H10K 59/80* | (2023.01) |
| *H10K 71/00* | (2023.01) |
| *H10K 50/18* | (2023.01) |
| *H10K 59/12* | (2023.01) |
| *H10K 102/00* | (2023.01) |

(52) U.S. Cl.
CPC ........... *H10K 50/17* (2023.02); *H10K 50/171* (2023.02); *H10K 50/813* (2023.02); *H10K 50/818* (2023.02); *H10K 50/844* (2023.02); *H10K 59/80515* (2023.02); *H10K 59/80518* (2023.02); *H10K 71/00* (2023.02); *H10K 71/621* (2023.02); *H10K 50/18* (2023.02); *H10K 50/181* (2023.02); *H10K 59/12* (2023.02); *H10K 59/873* (2023.02); *H10K 2102/3026* (2023.02)

(58) Field of Classification Search
CPC ........ H10K 50/15; H10K 50/16; H10K 50/17; H10K 50/18; H10K 50/844; H10K 59/805–80524; H10K 59/12; H10K 59/35; H10K 59/1201; H10K 30/865; H10K 71/00; H10K 71/621; G02B 30/27; G02B 30/30
See application file for complete search history.

(56) References Cited

U.S. PATENT DOCUMENTS

| | | | |
|---|---|---|---|
| 2016/0013252 A1 | 1/2016 | Wang | |
| 2021/0367184 A1 | 11/2021 | Song | |
| 2021/0408425 A1* | 12/2021 | Wang | ................ H10K 50/16 |
| 2022/0216447 A1 | 7/2022 | Liu et al. | |
| 2022/0376013 A1* | 11/2022 | Li | ................ H10K 59/80518 |
| 2023/0240100 A1* | 7/2023 | Choi | ................ H10K 59/122 |

FOREIGN PATENT DOCUMENTS

| | | |
|---|---|---|
| CN | 109920816 A | 6/2019 |
| CN | 110148621 A | 8/2019 |
| CN | 110164872 A | 8/2019 |
| CN | 210467891 U | 5/2020 |
| CN | 111769205 A | 10/2020 |

* cited by examiner

DISPLAY PANEL, MANUFACTURING METHOD THEREFOR, AND DISPLAY APPARATUS

CROSS REFERENCE TO RELATED APPLICATIONS

This application is a National Stage of International Application No. PCT/CN2021/092209, filed May 7, 2021, which claims priority to Chinese Patent Application No. 202010660421.2, filed to the China National Intellectual Property Administration on Jul. 10, 2020 and entitled "DISPLAY PANEL, MANUFACTURING METHOD THEREFOR, AND DISPLAY APPARATUS", which is hereby incorporated by reference in its entirety.

FIELD

The present disclosure relates to the field of display technologies, in particular to a display panel, a manufacturing method therefor and a display apparatus.

BACKGROUND

Naked eye 3D (be short for 3-dimensional) display technology is a display technology that enables people to watch realistic three-dimensional images without wearing 3D glasses. It frees a wearer from the shackles of traditional 3D glasses, fundamentally solves the problem of dizziness caused by wearing 3D glasses for a long time, and greatly improves people's viewing comfort.

According to different display principles, the naked eye 3D technology can be divided into grating type naked eye 3D technology and cylindrical lens 3D display technology. A left view and a right view are formed through a parallax barrier or cylindrical lens similar to a grating. Since the left view and the right view seen by the two eyes of a viewer are two images with parallax, after the left view and the right view with the parallax are superimposed and regenerated in the viewer's brain, the viewer can view a 3D display image with naked eyes. However, an existing naked eye 3D technology is low in resolution and cannot realize high-definition display.

SUMMARY

A display panel provided by embodiments of the present disclosure, includes:
a substrate, the substrate includes a plurality of sub-pixel units; and
each of the plurality of sub-pixel units includes at least two first electrodes which are independently arranged in a same layer, and each first electrode includes at least two conductive layers which are arranged in a stacked manner; an edge of a top conductive layer away from the substrate extends beyond an edge of a bottom conductive layer, an orthographic projection of the bottom conductive layer on the substrate falls within a range of an orthographic projection of the top conductive layer on the substrate, and a portion of the edge of the top conductive layer extending beyond the edge of the bottom conductive layer extends towards one side of the substrate to constitute a sloping surface.

In some embodiments, each first electrode includes two conductive layers arranged in a stacked manner, a material of the top conductive layer includes one or a combination of ITO, IZO, IGZO, TiN or Mo, and a material of the bottom conductive layer includes one or a combination of Al, AlNd, Mo, Ti or TiN.

In some embodiments, a slope angle of the sloping surface is smaller than 60°.

In some embodiments, a length of the sloping surface of the portion of the edge of the top conductive layer extending beyond the edge of the bottom conductive layer ranges from 0.2 µm to 0.6 µm.

In some embodiments, each of the plurality of sub-pixel units further includes an organic functional layer arranged on a side of the first electrodes facing away from the substrate; and the organic functional layer includes a light emitting layer and a light emitting crosstalk layer arranged between the first electrodes and the light emitting layer, and the light emitting crosstalk layer is a P-type doping layer;
the light emitting crosstalk layers in each of the plurality of the sub-pixel units are independent of each other, and the light emitting layers in each of the plurality of the sub-pixel units are independent of each other.

In some embodiments, in a direction facing away from the substrate, the organic functional layer further includes a hole injection layer, a hole transmission layer and an electron blocking layer arranged in a stacked manner between the first electrodes and the light emitting layer; and
hole injection layers in each of the plurality of the sub-pixel units are of an integrated structure, hole transmission layers in each of the plurality of the sub-pixel units are of an integrated structure, electron blocking layers in each of the plurality of the sub-pixel units are independent of each other, and the light emitting crosstalk layer is arranged between the electron blocking layers and the hole transmission layers.

In some embodiments, each organic functional layer further includes a hole blocking layer, an electron transmission layer and an electron injection layer arranged in a stacked manner in sequence on a side of the light emitting layer facing away from the substrate;
hole blocking layers in each of the plurality of the sub-pixel units are of an integrated structure, electron transmission layers in each of the plurality of the sub-pixel units are of an integrated structure, and electron injection layers in each of the plurality of the sub-pixel units are independent of each other; and
the electron injection layer is a N-type doping layer.

In some embodiments, a distance between adjacent first electrodes is smaller than or equal to 2.5 µm.

In some embodiments, a thickness of the light emitting crosstalk layer ranges from 600 angstroms to 1,200 angstroms, and a doping concentration of a P-type doping material in the light emitting crosstalk layer is smaller than or equal to 5%.

In some embodiments, the thickness of the light emitting crosstalk layer ranges from 900 angstroms to 1,000 angstroms, and the doping concentration of the P-type doping material in the light emitting crosstalk layer ranges from 3% to 5%.

In some embodiments, the display panel further includes: a planarization layer arranged between the substrate and the first electrodes; a cathode, a coupling light emitting layer and an encapsulation layer arranged in a stacked manner in sequence on a side of the organic functional layers facing away from the substrate; the first electrodes are anodes; and
the substrate comprises a plurality of driving electrodes, and each of the first electrodes is electrically connected with each of the driving electrodes through a via hole penetrating through the planarization layer respectively.

Embodiments of the present disclosure further provide a display apparatus, including the display panel provided by embodiments of the present disclosure.

Embodiments of the present disclosure further provide a manufacturing method of a display panel, including:

providing a substrate; and forming at least two first electrodes which are independently arranged in a same layer in each of a plurality of sub-pixel units in the substrate;

each first electrode comprises at least two conductive layers which are arranged in a stacked manner, an edge of a top conductive layer away from the substrate extends beyond an edge of a bottom conductive layer, an orthographic projection of the bottom conductive layer on the substrate falls within a range of an orthographic projection of the top conductive layer on the substrate, and a portion of the edge of the top conductive layer extending beyond the edge of the bottom conductive layer extends towards one side of the substrate to constitute a sloping surface.

In some embodiments, the forming at least two first electrodes which are independently arranged in a same layer in each of a plurality of sub-pixel units in the substrate, includes:

depositing a bottom conductive thin film on the substrate; wherein a material of the bottom conductive thin film comprises one or a combination of Al, AlNd, Mo, Ti or TiN;

depositing a top conductive thin film on a side of the bottom conductive thin film facing away from the substrate; wherein a material of the top conductive thin film comprises one or a combination of ITO, IZO, IGZO, TiN or Mo;

coating photoresist on a side, facing away from the substrate, of the top conductive thin film;

exposing and developing the photoresist;

etching off portions, with the photoresist removed, of the bottom conductive thin film and the top conductive thin film to form the top conductive layer;

wet-etching remaining bottom conductive thin film to form the bottom conductive layer, so as to make the edge of the top conductive layer extends beyond the edge of the bottom conductive layer;

peeling off remaining photoresist; and bombarding the top conductive layer by using plasma containing argon, oxygen and nitrogen to make the portion of the edge of the top conductive layer extending beyond the edge of the bottom conductive layer extend towards one side of the substrate to constitute the sloping surface.

DETAILED DESCRIPTION OF THE EMBODIMENTS

Figure 1:
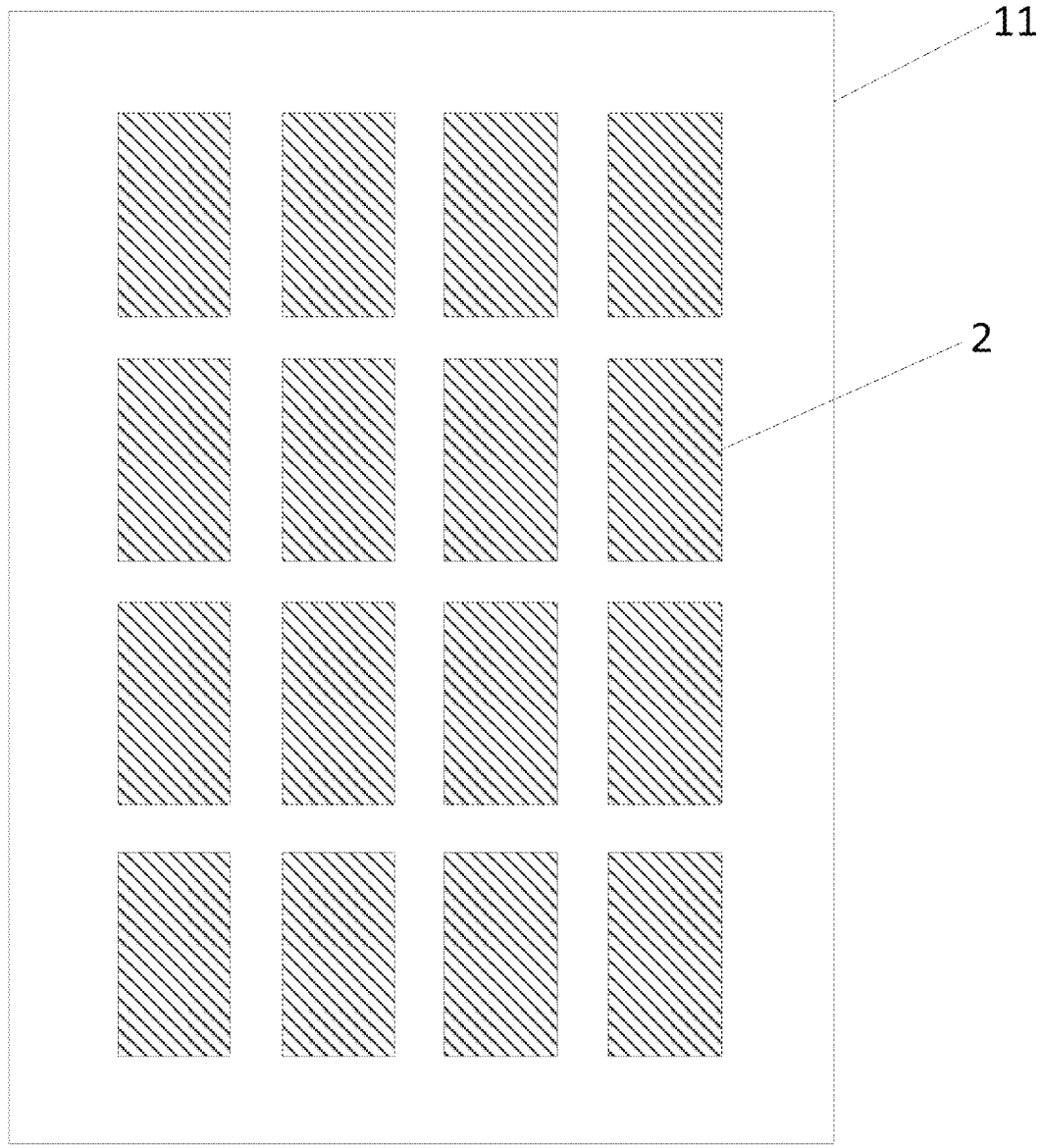
FIG. 1 is a schematic top view of a sub-pixel unit provided by an embodiment of the present disclosure.

To make the objectives, technical solutions and advantages of embodiments of the present disclosure clearer, the technical solutions of the embodiments of the present disclosure will be clearly and completely described below in conjunction with the accompanying drawings of the embodiments of the present disclosure. Apparently, the described embodiments are only a part of the embodiments of the present disclosure, not all of the embodiments. The embodiments in the present disclosure and features in the embodiments can be combined with each other in the case of not conflicting. Based on the described embodiments of the present disclosure, all other embodiments obtained by those of ordinary skill in the art without creative work shall fall within the protection scope of the present disclosure.

Unless otherwise defined, technical or scientific terms used in the present disclosure shall have the ordinary meanings understood by those ordinarily skilled in the art to which the present disclosure pertains. The words "comprise" or "include" and the like used in the present disclosure indicate that an element or item appearing before such word covers listed elements or items appearing after the word and equivalents thereof, and does not exclude other elements or items. The words "connect" or "couple" or the like are not limited to physical or mechanical connection, but may include electrical connection, whether direct or indirect. "Inner", "outer", "upper" and "lower" and the like are only used to represent relative position relationships, and the relative position relationships may also change accordingly after an absolute position of a described object is changed.

It needs to be noted that the sizes and shapes of all figures in the accompanying drawings do not reflect true scales, and are only intended to schematically illustrate the content of the present disclosure. The same or similar reference numerals represent the same or similar elements or elements with the same or similar functions all the time.

Figure 2:
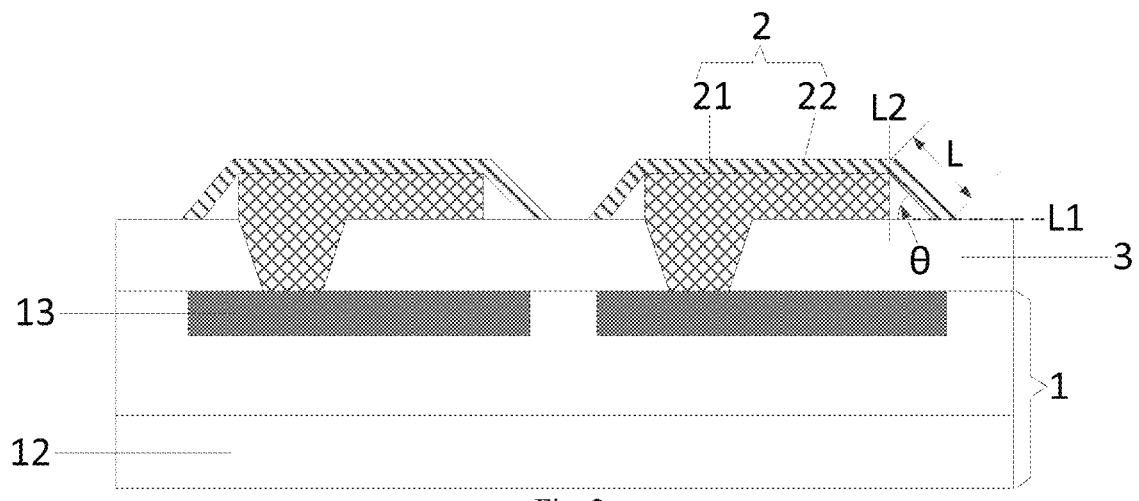
FIG. 2 is a schematic cross-sectional view of a display panel provided by an embodiment of the present disclosure.

An embodiment of the present disclosure provides a display panel, as shown in FIG. 1 and FIG. 2, including: a substrate 1. The substrate 1 includes a plurality of sub-pixel units 11, both FIG. 1 and FIG. 2 are described with one of the sub-pixel units 11 as an example. Each of the plurality of sub-pixel units 11 includes at least two first electrodes 2 independently arranged in a same layer. FIG. 1 is described by taking an example that one sub-pixel unit 11 includes 4*4 first electrodes 2, FIG. 2 only schematically shows two first electrodes 2 in one sub-pixel unit 11, and each first electrode 2 includes at least two conductive layers arranged in a stacked manner (taking two conductive layers 21 and 22 as an example).

Figure 3:
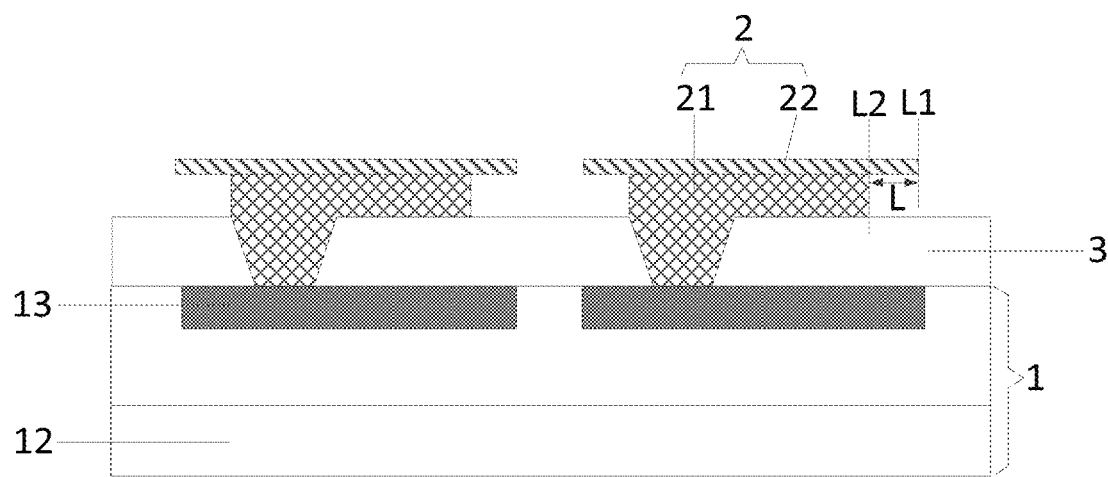
FIG. 3 is a schematic cross-sectional view of another display panel provided by an embodiment of the present disclosure.

An edge L1 of the top conductive layer 22 that is away from the substrate 1 extends beyond an edge L2 of the bottom conductive layer 21, an orthographic projection of the bottom conductive layer 21 on the substrate 1 falls within a range of an orthographic projection of the top conductive layer 22 on the substrate 1, and a portion (a portion between L1 and L2) of the edge L1 of the top conductive layer 22 extending beyond the edge L2 of the bottom conductive layer 21 extends towards one side of the substrate 1 to constitute a sloping surface. In order to clearly show the edge L1 of the top conductive layer 22 and the edge L2 of the bottom conductive layer 21, as shown in FIG. 3, FIG. 3 is a structure prior to the portion between L1 and L2 in FIG. 2 extending towards one side of the substrate 1.

It should be noted that said each sub-pixel unit 11 includes at least two first electrodes 2 independently arranged in the same layer, the same layer means arrangement in the same layer in physical position, that is, the plurality of first electrodes 2 in each sub-pixel unit 11 may be formed through one time of composition process, i.e., manufacturing with the same step of process and with the same material.

In some embodiments, different sub-pixel units 11 may be correspondingly provided with red R sub-pixels, green G sub-pixels and blue B sub-pixels respectively. The first electrodes 2 may be anodes or cathodes.

In some embodiments, as shown in FIG. 2, the display panel further includes a planarization layer 3 arranged between the substrate 1 and the first electrodes 2, and the first electrodes 2 are anodes. The substrate 1 may include an base substrate 12 and a plurality of driving electrodes 13 arranged on one side of the base substrate 12, and the first electrodes 2 are electrically connected with the corresponding driving electrodes 13 through via holes penetrating through the planarization layer 3 respectively.

In some embodiments, the driving electrodes 13 may be active type driving electrodes (active driving electrodes), such as sources or drains of thin film transistors; and the driving electrodes may also be passive type driving electrodes (passive driving electrodes), and driving electrodes that are able to independently drive the first electrodes 2 are all within the protection scope of this embodiment.

The at least two first electrodes 2 arranged in one sub-pixel unit 11 provided by the embodiment of the present disclosure divide each sub-pixel unit 11 into a plurality of sub-pixels, and since the first electrodes 2 are insulated from each other and connected with the different driving electrodes 13 respectively, the sub-pixels in the same sub-pixel unit 11 may be independently controlled for display.

In some embodiments, in a 3D displaying process, in combination with a grating type naked eye 3D technology or cylindrical lens 3D display technology or the like, light emitted from a part of sub-pixels in the same sub-pixel unit 11 may be controlled to enter the left eye, and light emitted from a part of sub-pixels may be controlled to enter the right eye. For example, in the two adjacent first electrodes 2 in FIG. 2, light emitted from a sub-pixel corresponding to the left first electrode 2 enters the left eye, light emitted from a sub-pixel corresponding to the right first electrode 2 enters the right eye, and thus high-resolution 3D naked eye display may be achieved, thereby overcoming the defects of low PPI, less information, small 3D view angle and the like of an existing 3D display product.

In the display panel provided by embodiments of the present disclosure, each sub-pixel unit (R, G and B pixels) is finely patterned into a plurality of sub-pixels again, such as the sub-pixels corresponding to the at least two first electrodes arranged in each sub-pixel unit, the first electrodes in the sub-pixels are insulated from each other and connected with the different driving electrodes respectively, and therefore display of each sub-pixel is independently driven. In combination with the grating type naked eye 3D technology or cylindrical lens 3D display technology or the like, the display panel provided by the embodiment of the present disclosure can realize high-resolution and high-definition naked eye 3D displaying, display richer information and increase a 3D view angle.

Further, in order to further improve the 3D naked eye display effect, as shown in FIG. 1, there are multiple first electrodes 2, and the first electrodes 2 are distributed in an array on a plane parallel to the substrate 1.

Further, in order to ensure that the quantity of the sub-pixels with light rays entering the left eye is the same as the quantity of the sub-pixels with light rays entering the right eye, both the quantity of rows and the quantity of columns of the sub-pixels included in each sub-pixel unit may be set to be even numbers. As shown in FIG. 1, for example, each sub-pixel unit 11 may be divided into 4*4 sub-pixels (the quantity of the first electrodes 2 is 16). Of course, each sub-pixel unit 11 may also be divided into 4*6 sub-pixels (the quantity of the first electrodes 2 is 24) or 6*6 sub-pixels (the quantity of the first electrodes 2 is 36). In practical applications, the arrangement manner of the first electrodes 2 may be designed according to actual conditions, and is not limited to the above array distribution.

Figure 4:
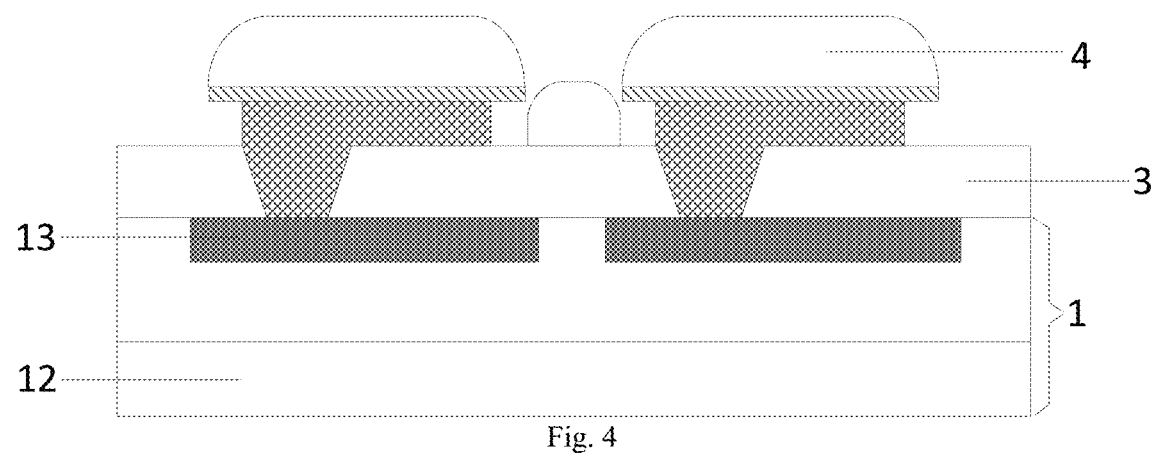
FIG. 4 is a schematic cross-sectional view of another display panel provided by an embodiment of the present disclosure.
Figure 5:
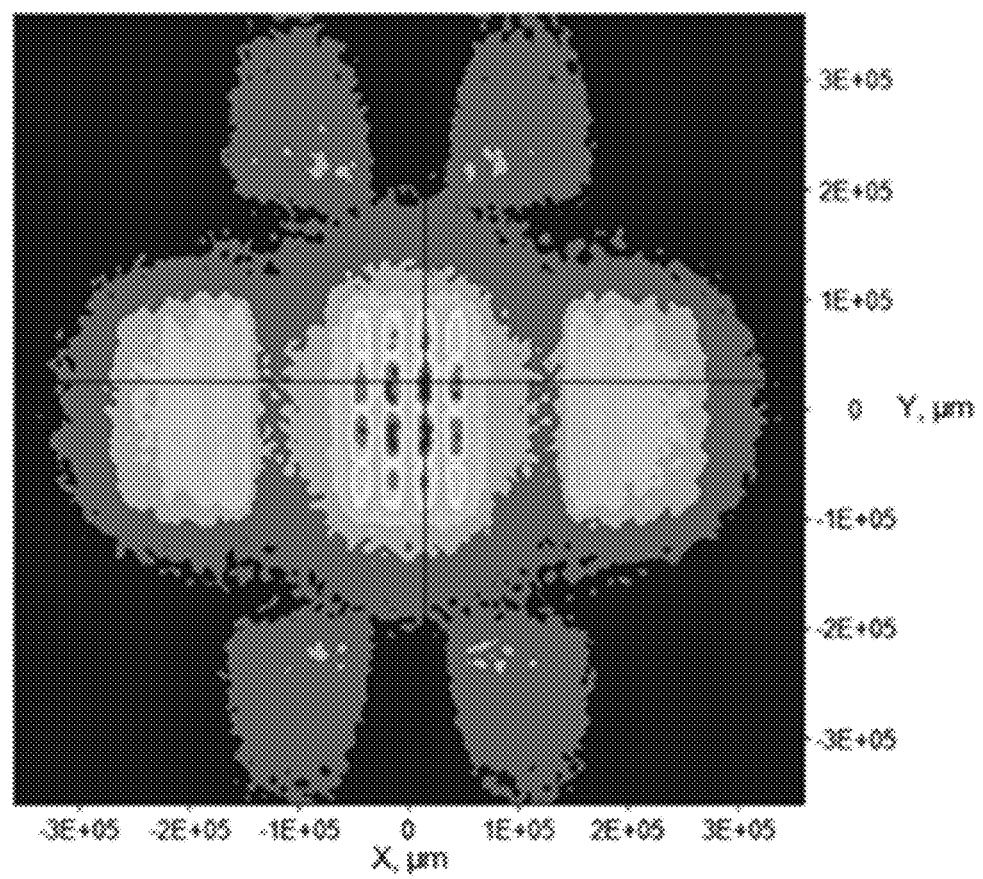
FIG. 5 is a schematic diagram of a moire effect provided by an embodiment of the present disclosure.
Figure 6:
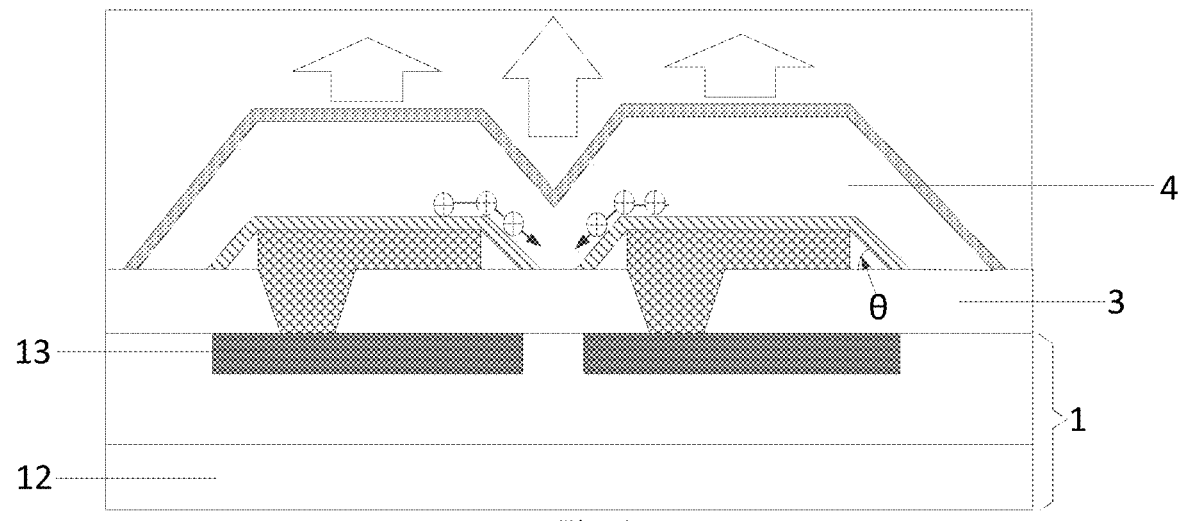
FIG. 6 is a schematic cross-sectional view of another display panel provided by an embodiment of the present disclosure.

The inventor of the disclosure found that, as shown in FIG. 1, by patterning the anodes of the sub-pixel units 11 again to form the independent first electrodes 2, the number of viewpoints independently controlled is increased, and the resolution of 3D displaying is increased. However, due to the fact that the anodes are etched into independent structures (the plurality of first electrodes 2) and edge segment differences of the first electrodes 2 exist, as shown in FIG. 4, the organic functional layer 4 of an OLED device is prone to breaking at spaces when subsequently formed, which causes no light emitting at the spaces of the adjacent first electrodes 2 in the sub-pixel units 11 and causes serious poor 3D displaying moires, as shown in FIG. 5. To avoid generation of the moires, as shown in FIG. 2, in the embodiment of the present disclosure, the portion (the portion between L1 and L2) of the edge L1 of the top conductive layer 22 exceeding the edge L2 of the bottom conductive layer 21 extends towards one side of the substrate 1 to constitute the sloping surface. As shown in FIG. 6, when the organic functional layer 4 of the OLED device is formed, since the sloping surface is relatively gentle, the organic functional layer 4 cannot break at the spaces. The principle of light emitting of OLEDs is that holes of anodes and electrons of cathodes are transmitted to a light emitting layer to emit light in a composite manner. Since the concentration of carriers in the light emitting layer corresponding to the first electrodes 2 is higher than the concentration of carriers at the spaces, the carriers will diffuse from the high concentration to the low concentration (shown by arrows), so that light is also emitted at the spaces, thereby realizing continuous light emitting between the sub-pixels in the same sub-pixel unit 11 and alleviating the phenomenon of moires.

In some embodiments, a conventional structure of the anode of the OLED device is an ITO/Ag/ITO overlapped structure, and an edge of the anode is covered and protected by a pixel defining layer. In some embodiments, each anode is patterned to form the independent first electrodes, edges of the first electrodes are not covered and protected by the pixel defining layer any more, and since an Ag reflecting film layer is prone to oxidation corrosion to cause defects such as low light emitting efficiency and electricity leakage of the OLED device, the structure of the first electrodes of the present disclosure is not applicable to the ITO/Ag/ITO overlapped structure. Therefore, in order to avoid oxidation corrosion of the patterned first electrodes, in the display panel provided by the embodiment of the present disclosure, as shown in FIG. 2, each first electrode 2 includes two conductive layers arranged in a stacked manner. A material of the top conductive layer 22 may include one or a combination of ITO, IZO, IGZO, TiN or Mo, and a material of the bottom conductive layer 21 may include one or a combination of Al, AlNd, Mo, Ti or TiN. In some embodiments, the bottom conductive layer 21 (i.e., reflective layer) of the first electrode 2 is made of AL or ALNd metal, at the same time, the top conductive layer 22 (ITO) is used as the OLED anode in a matched manner, and compared with the ITO/Ag/ITO overlapped structure as the OLED anode, the first electrode 2 of the present disclosure is good in structure stability.

Figure 7A:
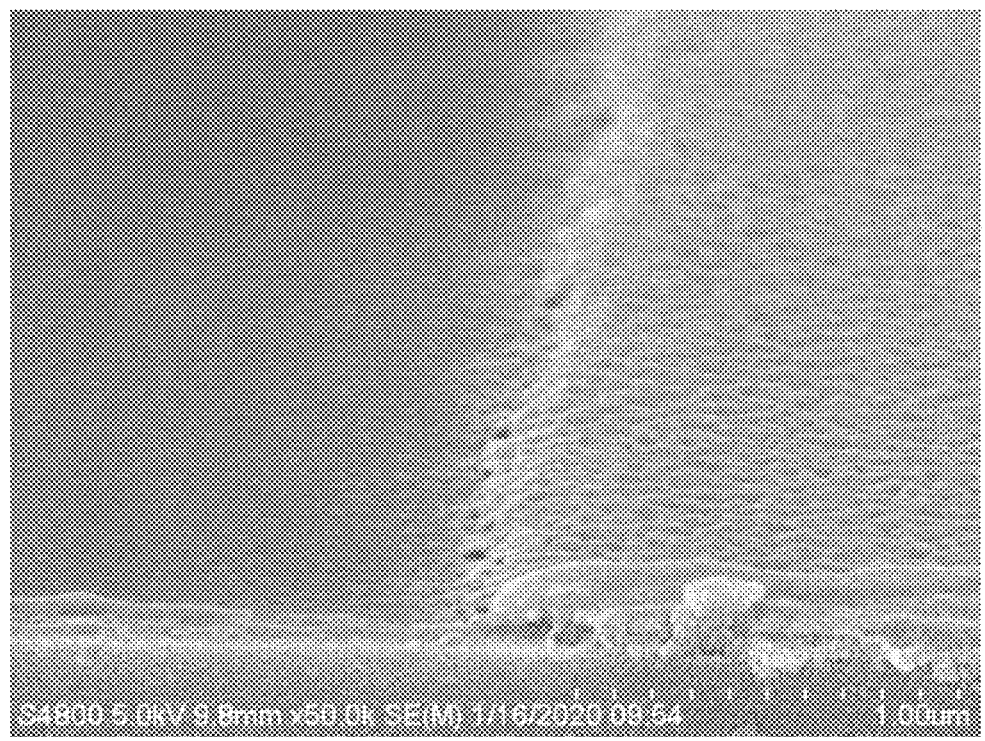
FIG. 7A is an SEM schematic diagram of a first electrode provided by an embodiment of the present disclosure.
Figure 7B:
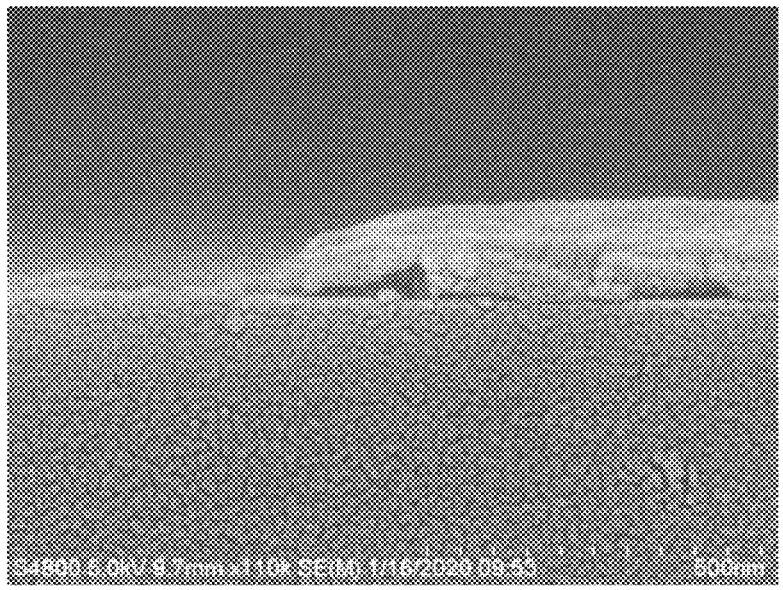
FIG. 7B is a schematic diagram of a local amplified structure in FIG. 7A.
Figure 8A:
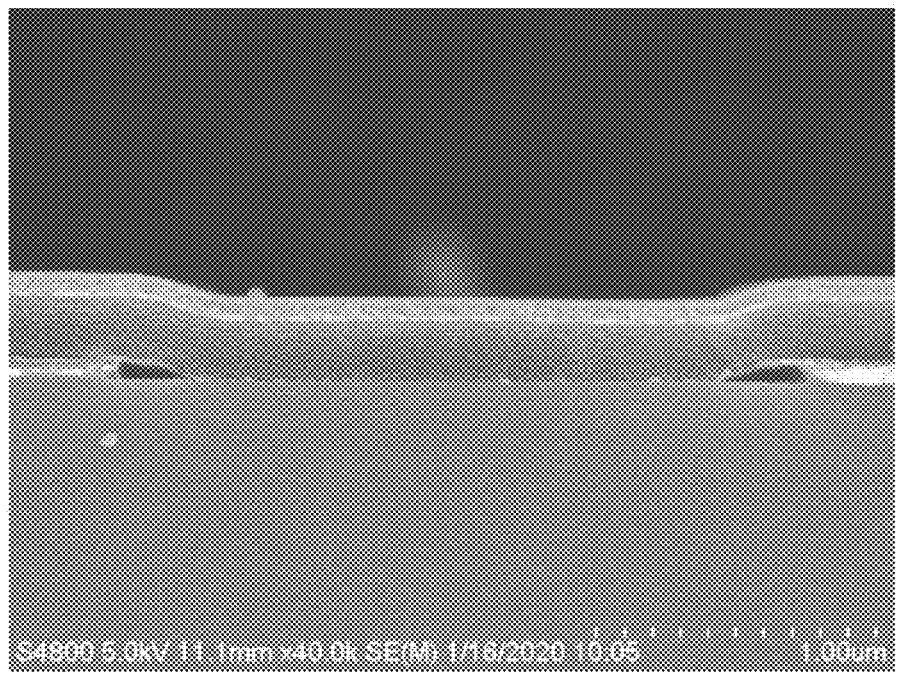
FIG. 8A is an SEM schematic diagram of an organic functional layer provided by an embodiment of the present disclosure.
Figure 8B:
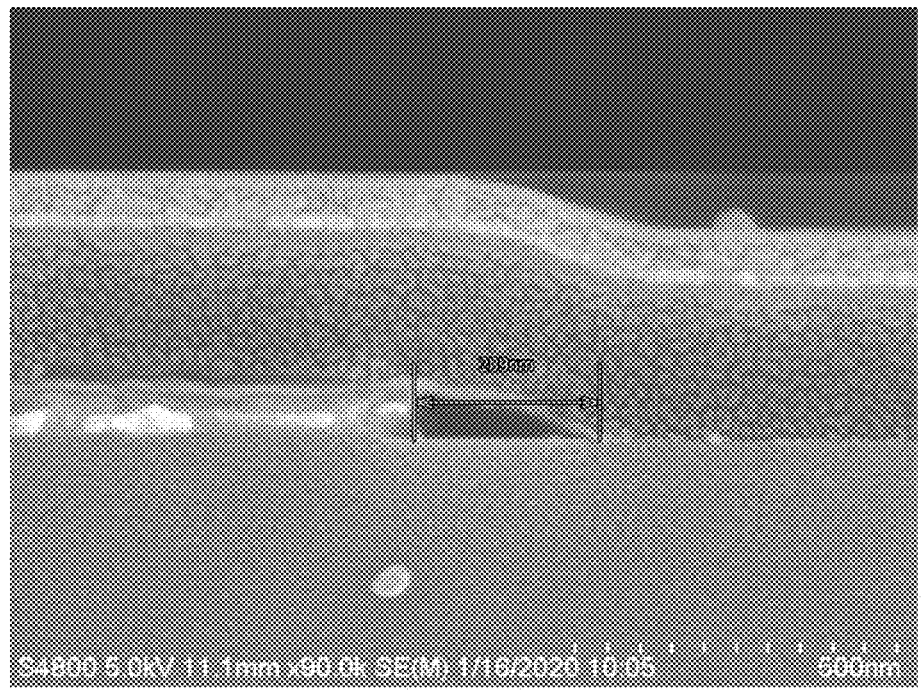
FIG. 8B is a schematic diagram of a local amplified structure in FIG. 8A.

As shown in FIG. 7A and FIG. 7B, FIG. 7A is an SEM structure diagram of the first electrode 2 provided by embodiments of the present disclosure, FIG. 7B is a local amplified diagram of FIG. 7A, and it can be seen that the edge of the first electrode manufactured in the embodiment of the present disclosure has a sloping surface structure extending towards one side of the substrate. As shown in FIG. 8A and FIG. 8B, FIG. 8A is an SEM structure diagram of the organic functional layer provided by the embodiment of the present disclosure, FIG. 8B is a local amplified diagram of FIG. 8A, concave position, in FIG. 8A, is space, and it can be seen that the organic functional layer manufactured on the first electrode 2 provided by the embodiment of the present disclosure is continuous at the space and does not break.

In order to guarantee that the top conductive layer is gentler, in the display panel provided by embodiments of the present disclosure, as shown in FIG. 2 and FIG. 6, a slope angle θ of the sloping surface may be smaller than 60°, and in this way, it can be further guaranteed that the formed organic functional layer 4 of the OLED device cannot break.

In some embodiments, in order to guarantee the mutual insulation between the adjacent first electrodes, and guarantee the top conductive layer is in contact with the planarization layer 3, in the display panel provided by the embodiment of the present disclosure, as shown in FIG. 2 and FIG. 3, a length L of the sloping surface of the portion (the portion between L1 and L2) of the edge L1 of the top conductive layer 22 extending beyond the edge L2 of the bottom conductive layer 21 may be 0.2 µm to 0.6 µm.

In some embodiments, when the first electrode 2 shown in FIG. 2 of the embodiment of the present disclosure is manufactured, the bottom conductive layer and the top conductive layer are deposited as whole surfaces respectively first, the patterned electrode structure is then formed through a composition process, and then the bottom conductive layer is etched by adopting wet etching to form the structure in FIG. 3, and finally the top conductive layer (ITO layer) is bombarded by plasma such as argon, oxygen and nitrogen under the effect of a high-frequency electric field. Since argon has high energy, the portion of the edge of the top conductive layer exceeding the edge of the bottom conductive layer may be made to extend towards one side of the substrate (i.e., the ITO layer droops) to form the sloping surface.

Figure 9:
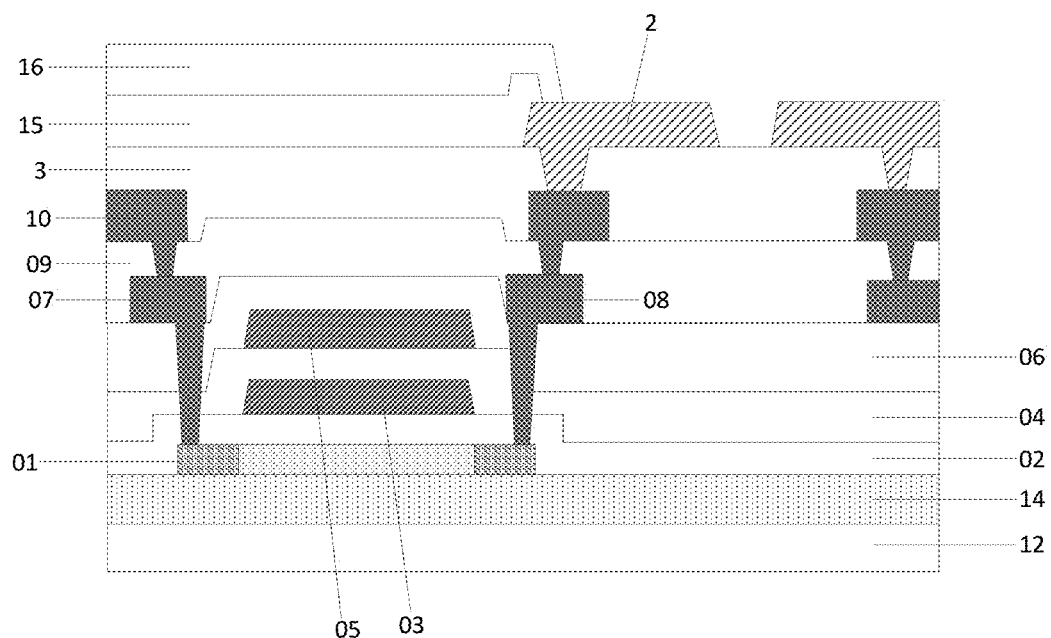
FIG. 9 is a schematic diagram of a cross-sectional structure of a substrate in a display panel provided by an embodiment of the present disclosure.

In some embodiments, as shown in FIG. 9, the substrate 1 includes: the base substrate 12, a buffer layer 14 located on a side of the base substrate 12 close to the planarization layer 3, as well as a first thin film transistor T1 and a second thin film transistor T2 (only a T2 driving electrode is schematically shown) located on a side of the buffer layer 14 close to the planarization layer 3. The first thin film transistor T1 and the second thin film transistor T2 each include an active layer 01, a first gate insulating layer 02, a first gate layer 03, a second gate insulating layer 04, a second gate layer 05, an interlayer insulating layer 06 and a first source-drain metal layer (source 07 and drain 08). The display panel further includes a first passivation layer 09 located on sides of the first thin film transistor T1 and the second thin film transistor T2 facing away from the substrate 1, a second source-drain metal layer 10 located on a side of the first passivation layer 09 facing away from the substrate 1, the planarization layer 3 located on a side of the second source-drain metal layer 10 facing away from the substrate 1, the first electrode 2 located on a side of the planarization layer 3 facing away from the substrate 1, a second passivation layer 15 located on a side of the first electrode 2 facing away from the substrate 1 and a pixel defining layer 16 located on a side of the second passivation layer 15 facing away from the substrate 1. The second passivation layer 15 and the pixel defining layer 16 expose the first electrode 2. Since the first passivation layer 09 and the planarization layer 3 are large in thickness, the second source-drain metal layer 10 is used as a connecting portion to connect the first electrode 2 with the driving electrode 13 (the source 07 or the drain 08 of the thin film transistor). In the embodiment of the present disclosure, the driving electrode is an active type driving electrode (active driving electrode).

Figure 10:
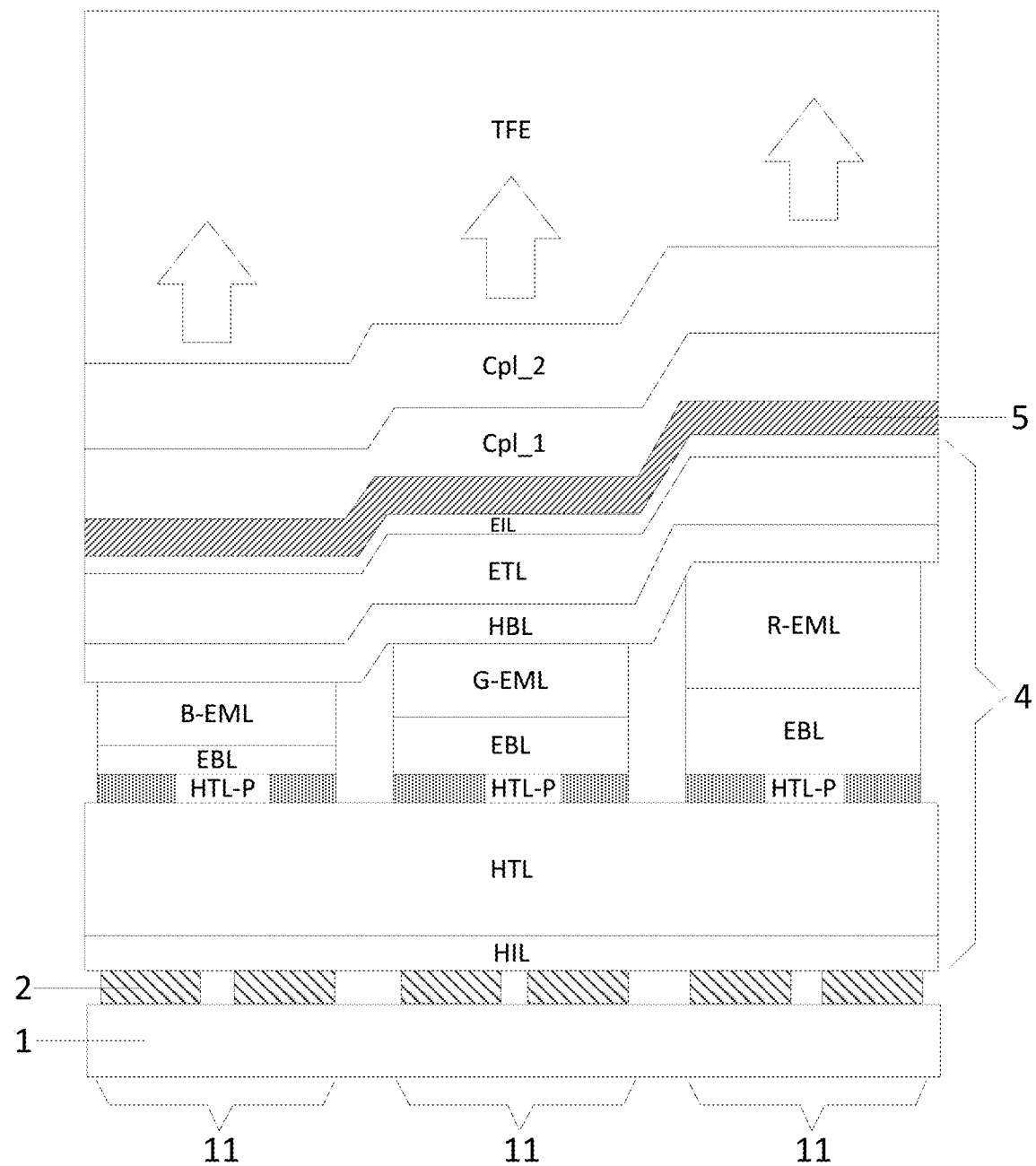
FIG. 10 is a schematic diagram of a cross-sectional structure of an organic functional layer in a display panel provided by an embodiment of the present disclosure.

In some embodiments, since the spaces between the first electrodes may be ≤2.5 µm at present, the inventor of the disclosure found that, continuous light emitting in the same sub-pixel unit can be achieved by only adopting the structure of the first electrodes provided by the embodiment of the present disclosure only when the spaces between the first electrodes is smaller than 0.5 µm, however, due to limitation of manufacturing processes, the spaces between the first electrodes generally can only be about 1.5-2.5 µm, in this way, due to the relatively large spaces between the first electrodes, even if the structure shown in FIG. 2 is adopted by the first electrodes, few carriers are transmitted to the spaces, light emitting at the spaces is difficult to realize, and thus light emitting crosstalk between the sub-pixel units needs to be increased in order to further guarantee continuous light emitting in the same sub-pixel unit. Therefore, in the display panel provided by the embodiment of the present disclosure, as shown in FIG. 10, each sub-pixel unit 11 further includes the organic functional layer 4 arranged on a side of the first electrodes 2 facing away from the substrate 1. The organic functional layer 4 includes a light emitting layer (a light emitting layer R-EML corresponding to the red R sub-pixel unit, a light emitting layer G-EML corresponding to the green G sub-pixel unit, and a light emitting layer B-EML corresponding to the blue B sub-pixel unit) and a light emitting crosstalk layer HTL-P between the first electrodes 2 and the light emitting layer (R-EML, G-EML and B-EML). The light emitting crosstalk layer HTL-P is a P-type doping layer. Since the organic functional layer 4 generally further includes a hole transmission layer HTL, an intrinsic material of the light emitting crosstalk layer HTL-P may be a material of the hole transmission layer HTL, and then a P-type material is doped in HTL to form the P-type doped light emitting crosstalk layer HTL-P. Compared with the hole transmission layer HTL, the P-type doped light emitting crosstalk layer HTL-P may increase the mobility of the carriers by 10 times or above, so that arranging the light emitting crosstalk layer HTL-P between the first electrodes 2 and the light emitting layer in the present disclosure may increase the mobility of the carriers, thereby increasing the probability of diffusion of the carriers towards the spaces, and further increasing the possibility of light emitting at the spaces, and therefore continuous light emitting in the same sub-pixel unit is further guaranteed.

In order to prevent intrinsic light emitting crosstalk of the adjacent sub-pixel units 11, the light emitting crosstalk layers HTL-P in the sub-pixel units 11 are independent of each other, and the light emitting layers (R-EML, G-EML and B-EML) in the sub-pixel units 11 are independent of each other.

In some embodiments, as shown in FIG. 10, in a direction facing away from the substrate 1, the organic functional layer 4 further includes a hole injection layer HIL, a hole transmission layer HTL and an electron blocking layer EBL arranged in a stacked manner between the first electrodes 2 and the light emitting layer (R-EML, G-EML and B-EML).

The hole injection layers HIL in the sub-pixel units 11 may be of an integrated structure, the hole transmission layers HTL in the sub-pixel units 11 may be of an integrated structure, the electron blocking layers EBL in the sub-pixel units 11 are independent of each other. Considering manufacturing processes and the effect of increasing the mobility of the carriers, the light emitting crosstalk layers HTL-P provided by the embodiment of the present disclosure are arranged to be located between the electron blocking layers EBL and the hole transmission layers HTL. In this way, since the light emitting crosstalk layer HTL-P is formed by doping the material of the hole transmission layer HTL and the P-type material, when the hole transmission layer HTL is manufactured, a thickness of the hole transmission layer HTL may be correspondingly increased, and then the light emitting crosstalk layer HTL-P is formed by doping the P-type material in the hole transmission layer HTL of a certain thickness on the side close to the light emitting layer.

Figure 11:
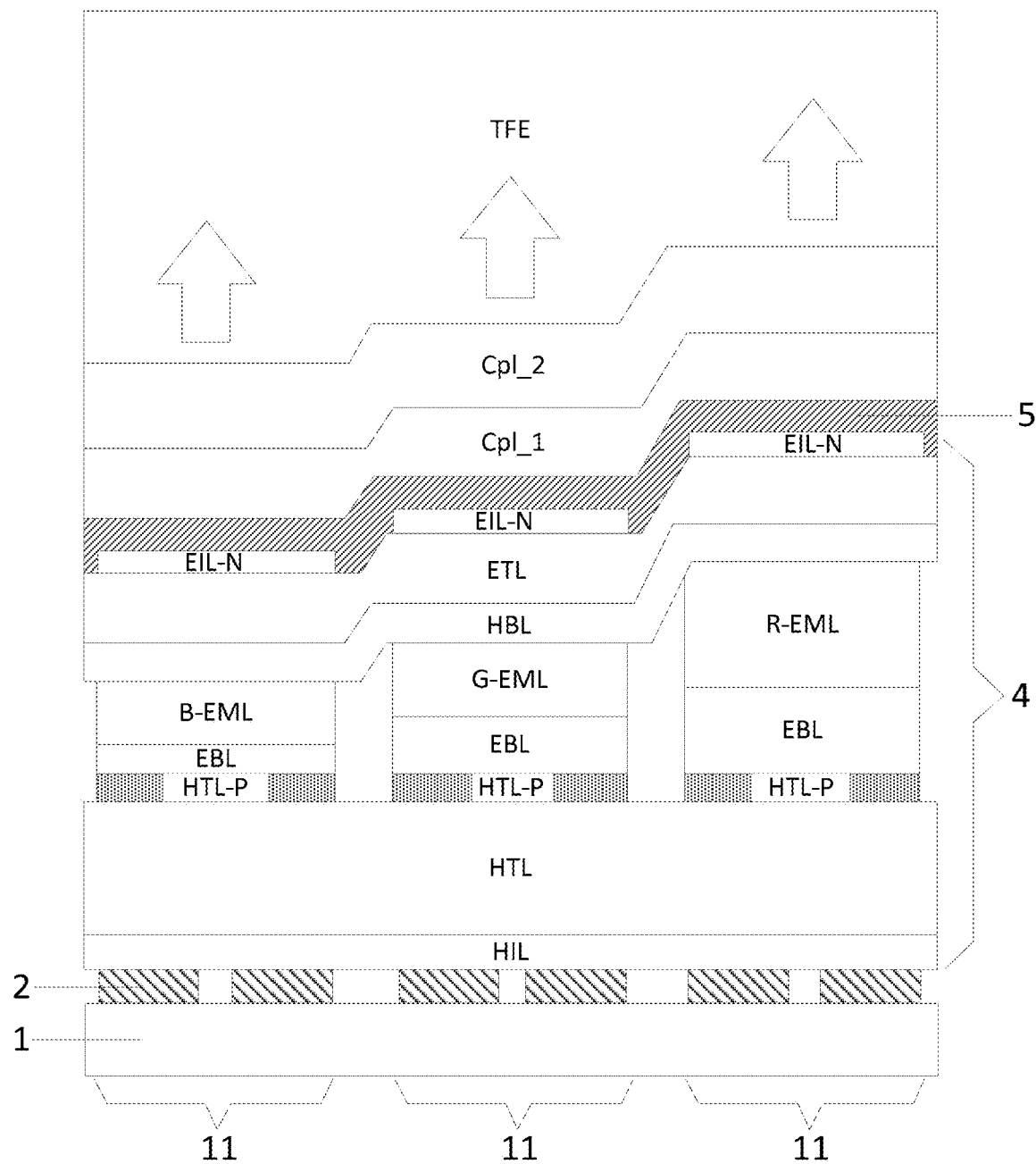
FIG. 11 is a schematic diagram of another cross-sectional structure of an organic functional layer in a display panel provided by an embodiment of the present disclosure.

In some embodiments, as shown in FIG. 11, the organic functional layer 4 further includes a hole blocking layer HBL, an electron transmission layer ETL and an electron injection layer EIL arranged in a stacked manner in sequence on a side of the light emitting layer (R-EML, G-EML and B-EML) facing away from the substrate 1.

The hole blocking layers HBL in the sub-pixel units 11 may be of an integrated structure, and the electron transmission layers ETL in the sub-pixel units 11 may be of an integrated structure.

Since the hole mobility is increased by arranging the light emitting crosstalk layer HTL-P in FIG. 10, in order to balance the electron mobility, the electron injection layers EIL in the sub-pixel units 11 in the embodiment of the present disclosure are arranged to be independent of each other (EIL-N), and the electron injection layers EIL are N-type doping layers. Since the electron injection layers EIL in the sub-pixel units 11 are of an integrated structure originally, in order to balance the electron mobility and prevent intrinsic light emitting crosstalk of the adjacent sub-pixel units 11, in the embodiment of the present disclosure, the electron injection layers EIL in the sub-pixel units 11 are arranged to be independent of each other, and the electron injection layers EIL are the N-type doping layers. Compared with the original electron injection layers EIL, the electron mobility of the N-type doped electron injection layers EIL may be increased by tens of times or above, and thus the present disclosure increases the electron mobility and the hole mobility at the same time, thereby balancing the concentration of the carriers and increasing the quantity of mobilization of the carriers, and therefore the purpose of continuous light emitting at the spaces is further achieved.

Figure 12A:
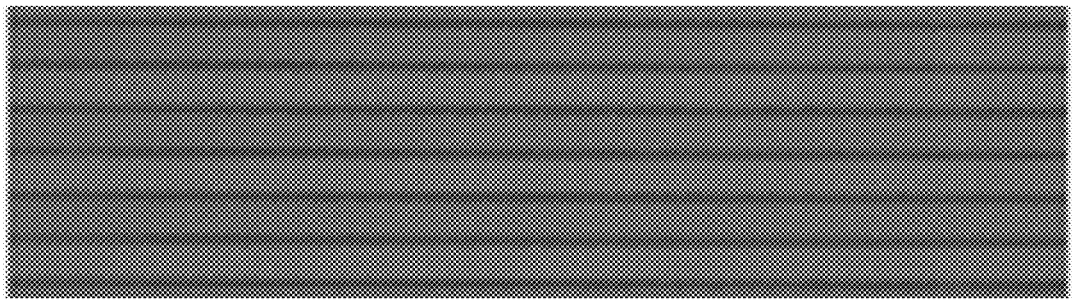
FIG. 12A to FIG. 12C are respectively schematic diagrams of display effects corresponding to light emitting crosstalk layers of different doping thicknesses in a display panel provided by embodiments of the present disclosure.
Figure 12B:
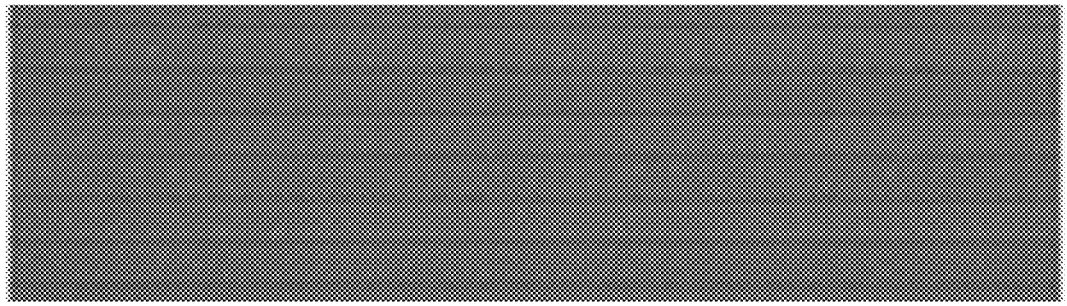
Figure 12C:
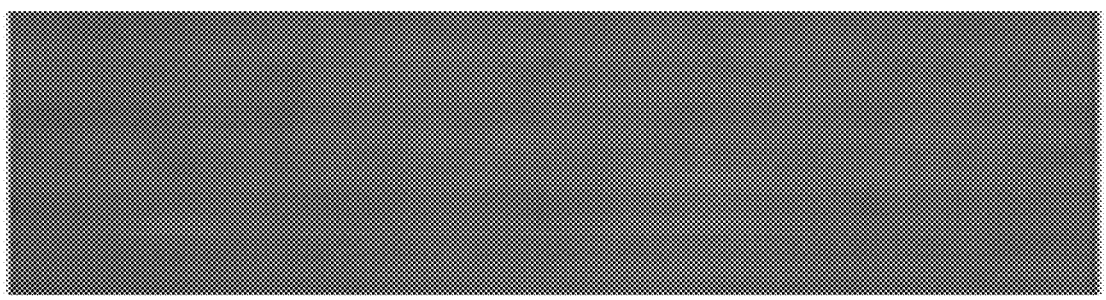

In some embodiments, as shown in FIG. 10 and FIG. 11, a thickness of the light emitting crosstalk layer HTL-P may be 600 angstroms to 1,200 angstroms, and a doping concentration of the P-type doping material in the light emitting crosstalk layer HTL-P is smaller than or equal to 5%. In some embodiments, the optimal thickness of the light emitting crosstalk layer HTL-P is directly proportional to a width of the spaces, the larger the width of the spaces, the larger the thickness of the required light emitting crosstalk layer HTL-P, and on the contrary, the smaller the spaces, the smaller the thickness of the light emitting crosstalk layer HTL-P. As shown in FIG. 12A to FIG. 12C, FIG. 12A to FIG. 12C are respectively schematic diagrams of microscope pictures of the first electrodes in the sub-pixel units corresponding to the light emitting crosstalk layers HTL-P of different thicknesses, the thickness of the light emitting crosstalk layer HTL-P corresponding to FIG. 12A is 700 Angstroms, the thickness of the light emitting crosstalk layer HTL-P corresponding to FIG. 12B is 850 Angstroms, and the thickness of the light emitting crosstalk layer HTL-P corresponding to FIG. 12C is 1,150 Angstroms. Transverse black lines in FIG. 12A to FIG. 12C represent the spaces, and it can be seen that with increase of the thickness of the light emitting crosstalk layer HTL-P, the transverse black lines are gradually blurred, that is, with increase of the thickness of the light emitting crosstalk layer HTL-P, light emitting at the spaces is better and better, namely continuous light emitting is realized.

Figure 13A:
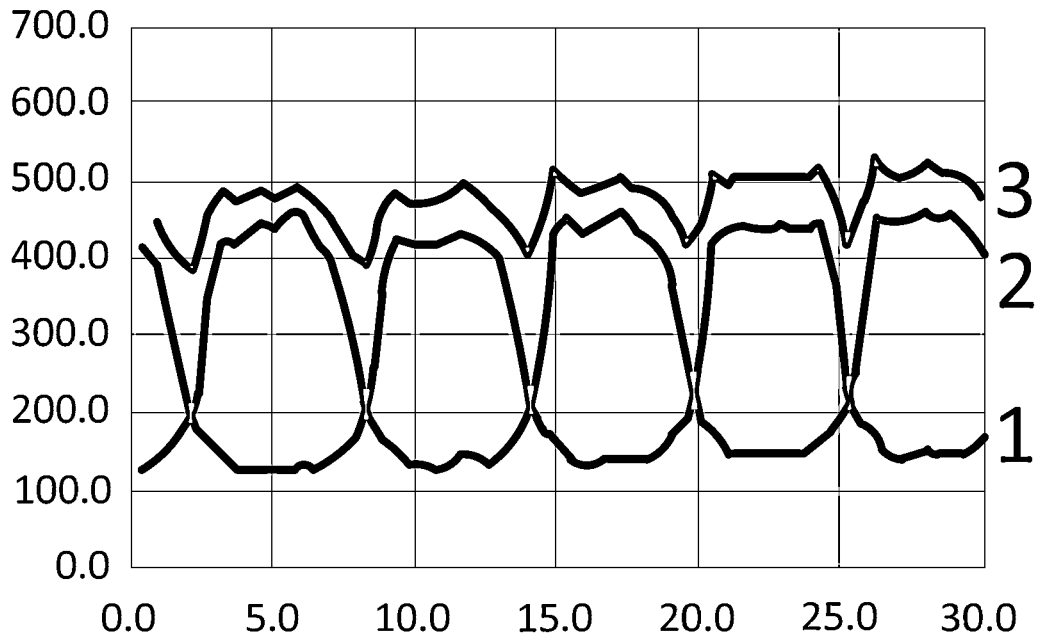
FIG. 13A to FIG. 13B are respectively schematic diagrams of sub-pixel optical crosstalk tests corresponding to light emitting crosstalk layers of different doping thicknesses in a display panel provided by embodiments of the present disclosure.
Figure 13B:
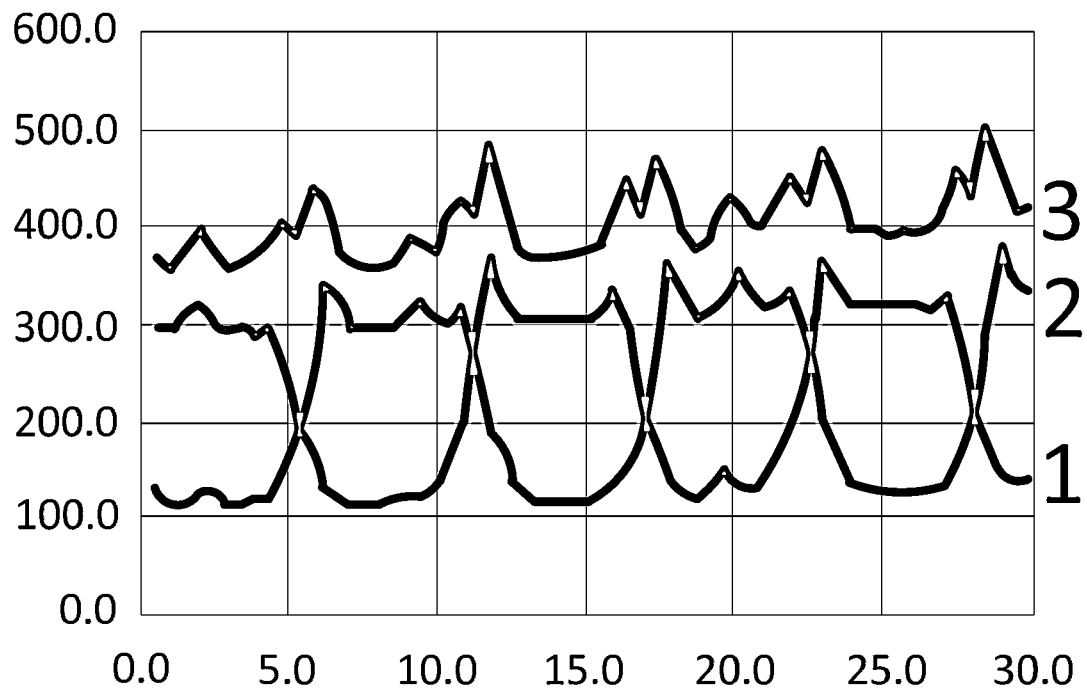

As shown in FIG. 13A and FIG. 13B, embodiments of the present disclosure further provide optical crosstalk tests (microscope 20X+CCD) for the sub-pixel units. FIG. 13A is a test result diagram when the thickness of the light emitting crosstalk layer HTL-P is fixed to 850 Angstroms, in FIG. 13A, curves 1 and 2 respectively represent light emitting luminance when odd rows and even rows of sub-pixels are lightened, a curve 3 represents light emitting luminance when all the sub-pixels are lightened, it can be seen that the curve 3 in FIG. 13A has lower tip positions protruding downwards, and the lower tip positions are light emitting luminance at the spaces. FIG. 13B is a test result diagram when the thickness of the light emitting crosstalk layer HTL-P is fixed to 1,150 Angstroms, compared with FIG. 13A, it can be seen that the lower tip positions of the curve 3 become gentle and protrude upwards, at the same time, the curves 1 and 2 also have upward protrusions, and it shows that with the increase of the thickness of the light emitting crosstalk layer HTL-P, the light emitting luminance at the spaces is increased, and the effect of continuous light emitting is achieved.

In some embodiments, as shown in FIG. 10 and FIG. 11, it is the best when the doping concentration of the P-type doping material in the light emitting crosstalk layer ranges from 3% to 5%; and when the width of the spaces is 2.5 μm, it is the best when the thickness of the light emitting crosstalk layer HTL-P ranges from 900 Angstroms to 1,000 Angstroms.

In some embodiments, as shown in FIG. 10 and FIG. 11, the display panel further includes a cathode 5, a coupling light emitting layer and an encapsulation layer TFE arranged in a stacked manner in sequence on a side of the organic functional layer 4 facing away from the substrate 1. The coupling light emitting layer generally includes a first coupling light emitting layer Cpl_1 improving light emitting efficiency and a second coupling light emitting layer Cpl_2 changing a light emitting view angle. The encapsulation layer TFE generally includes inorganic layers-organic layers arranged alternately, and the encapsulation layer TFE has a function of blocking water oxygen from corroding an OLED device.

In some embodiments, the display panel is an OLED display panel, and the OLED display panel may be of a top emitting structure or a bottom emitting structure. When the OLED display panel is of the top emitting structure, the first electrodes 2 may be multiplexed as reflective layers. In the top-emitting OLED display panel, anodes in the R/G/B sub-pixel units are patterned, the plurality of anodes (first electrodes 2) independently drive the corresponding sub-pixels, and thus maximization of the dividing quantity of pixels in each sub-pixel unit is achieved. For example, 4*4 sub-pixel division may be achieved on the basis of the retina resolution (326 PPI), so that the 3D display resolution of OLEDs is increased, and the 3D display image quality is improved. By arranging the structure of the first electrodes shown in FIG. 2, continuous light emitting at the spaces between the sub-pixels can be achieved, that is, a light emitting area of the sub-pixels is enlarged, the life of an EL device is indirectly prolonged, and generation of moires is avoided at the same time.

In some embodiments, the substrate 1 may further include a gate driver on array (GOA), an EM GOA (EOA), a driving circuit, a compensation circuit and other structures arranged on the base substrate.

According to the technical solution of the present disclosure, the anodes in the sub-pixel units are finely patterned again, and the structure design of the first electrodes 2 shown in FIG. 2 is adopted, so that light emitting of the sub-pixel units can be made continuous. After light passes a metasurface sub pixel lens, the influence of moires can also be lowered to the minimum, the problems of low visual resolution and discontinuous views of existing naked eye 3D are solved, the visible area of a 3D view is larger, and the 3D view is closer to the real world.

Figure 14:
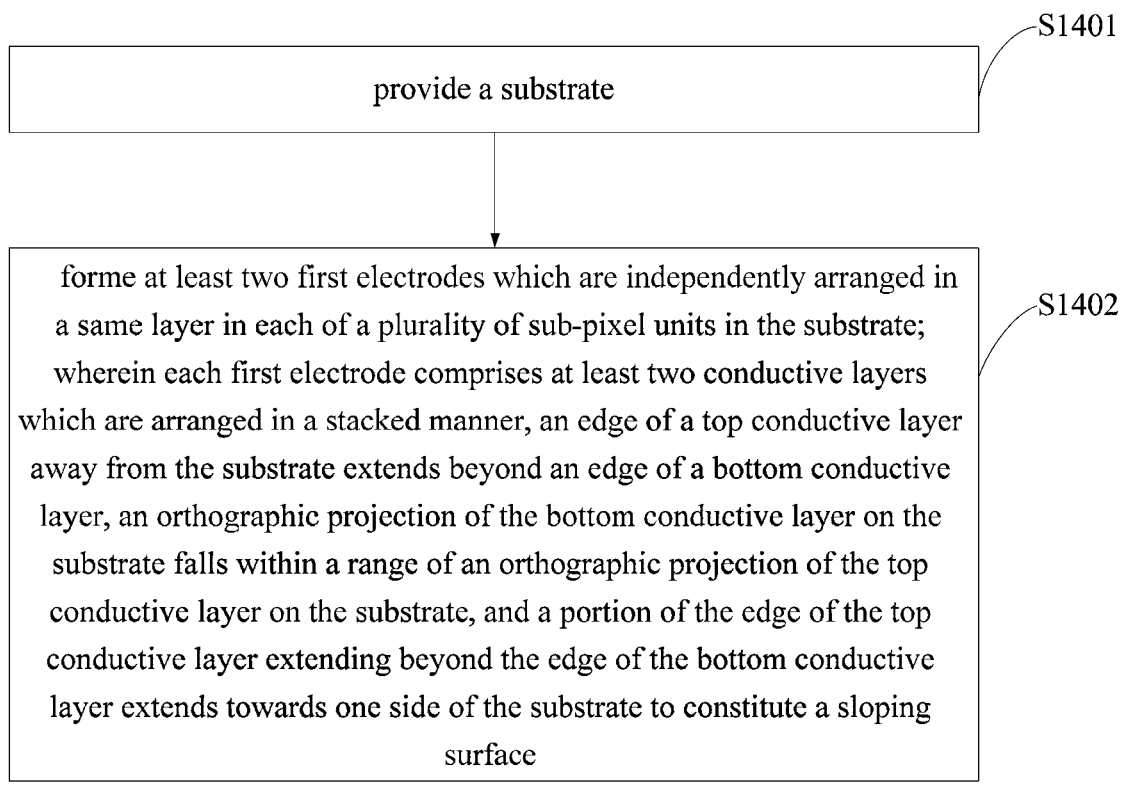
FIG. 14 is a schematic flow diagram of a manufacturing method of a display panel provided by an embodiment of the present disclosure.

Based on the same inventive concept, embodiments of the present disclosure further provide a manufacturing method of a display panel, as shown in FIG. 14, including:

S1401, a substrate is provided; and

S1402, at least two first electrodes which are independently arranged in a same layer are formed in each of a plurality of sub-pixel units in the substrate. Each first electrode includes at least two conductive layers which are arranged in a stacked manner, an edge of a top conductive layer that is away from the substrate extends beyond an edge of a bottom conductive layer, an orthographic projection of the bottom conductive layer on the substrate falls within a range of an orthographic projection of the top conductive layer on the substrate, and a portion of the edge of the top conductive layer extending beyond the edge of the bottom conductive layer extends towards one side of the substrate to constitute a sloping surface.

Figure 15:
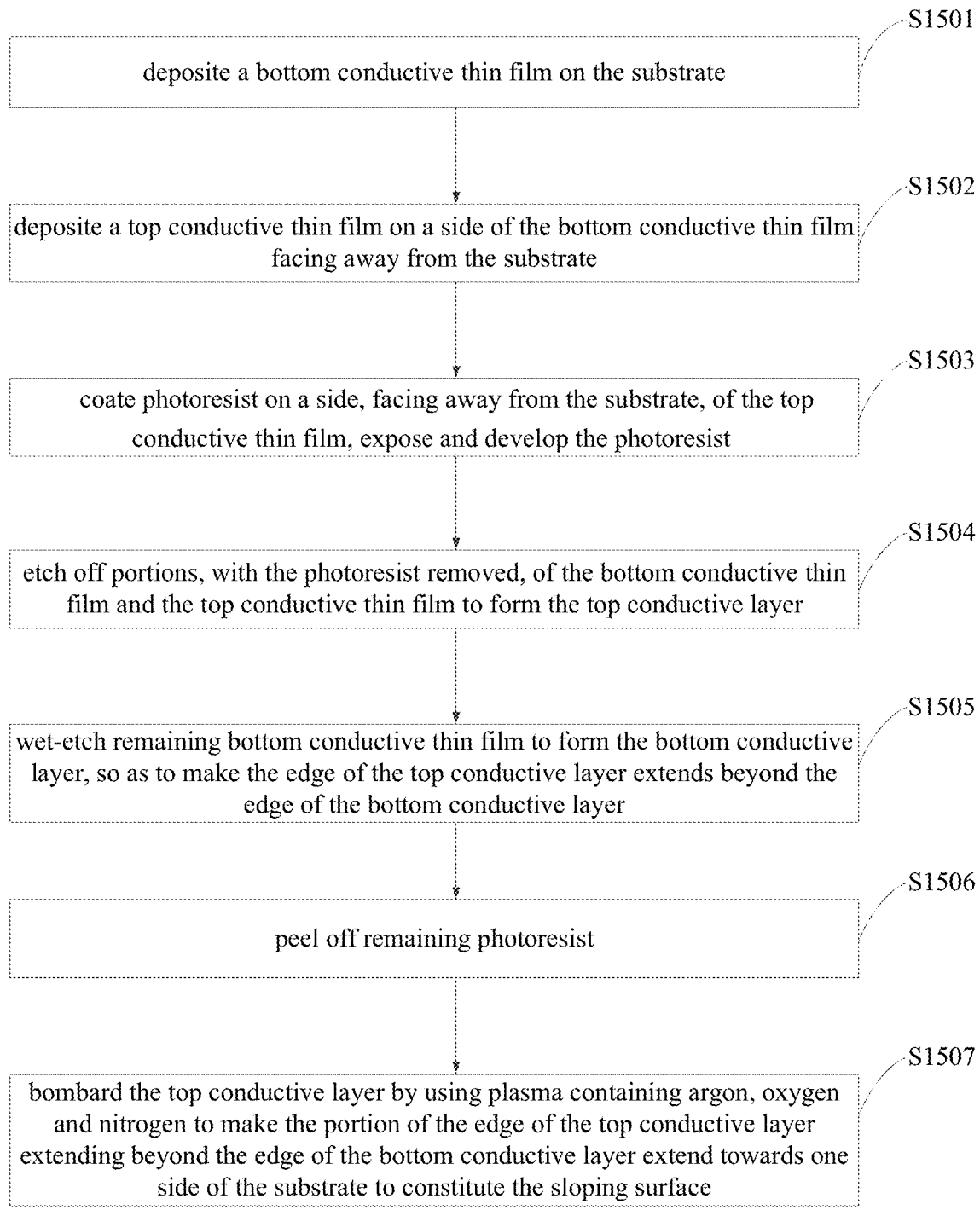
FIG. 15 is a schematic flow diagram of another manufacturing method of a display panel provided by an embodiment of the present disclosure.

In the manufacturing method provided by embodiments of the present disclosure, as shown in FIG. 15, the step that the at least two first electrodes which are independently arranged are formed in each sub-pixel unit of the substrate, includes the following steps.

S1501, a bottom conductive thin film is deposited on the substrate. A material of the bottom conductive thin film includes one or a combination of Al, AlNd, Mo, Ti or TiN. Specifically, the substrate may include an base substrate and a plurality of driving electrodes formed on a side of the base substrate.

S1502, a top conductive thin film is deposited on a side of the bottom conductive thin film facing away from the substrate. A material of the top conductive thin film includes one or a combination of ITO, IZO, IGZO, TiN or Mo.

In some embodiments, the bottom conductive thin film and the top conductive thin film may be deposited through a sputtering process.

S1503, a side of the top conductive thin film facing away from the substrate is coated with photoresist, and the photoresist is exposed and developed.

S1504, portions, with the photoresist removed, of the bottom conductive thin film and the top conductive thin film are etched to form a top conductive layer.

S1505, the remaining bottom conductive thin film is wet-etched to form a bottom conductive layer so as to make an edge of the top conductive layer exceed an edge of the bottom conductive layer.

S1506, remaining photoresist is peeled off.

S1507, the top conductive layer is bombarded by using plasma containing argon, oxygen and nitrogen to make a portion of the edge of the top conductive layer exceeding the edge of the bottom conductive layer extend towards one side of the substrate to constitute a sloping surface.

In some embodiments, the top conductive layer (ITO layer) is bombarded by using plasma containing argon, oxygen and nitrogen under the effect of a high-frequency electric field, and since argon has high energy, the portion of the edge of the top conductive layer extending beyond the edge of the bottom conductive layer may be made to extend towards one side of the substrate (i.e., the top conductive layer droops) to constitute the sloping surface.

Based on the same inventive concept, embodiments of the present disclosure further provide a display apparatus, including any display panel provided by the embodiment of the present disclosure. The display apparatus may be: a mobile phone, a tablet computer, a television, a display, a laptop, a digital photo frame, a navigator and any product or component with a 2D or 3D display function. Implementation of the display apparatus may refer to the embodiment of the above display panel, and repeated parts are omitted herein.

Figure 16:
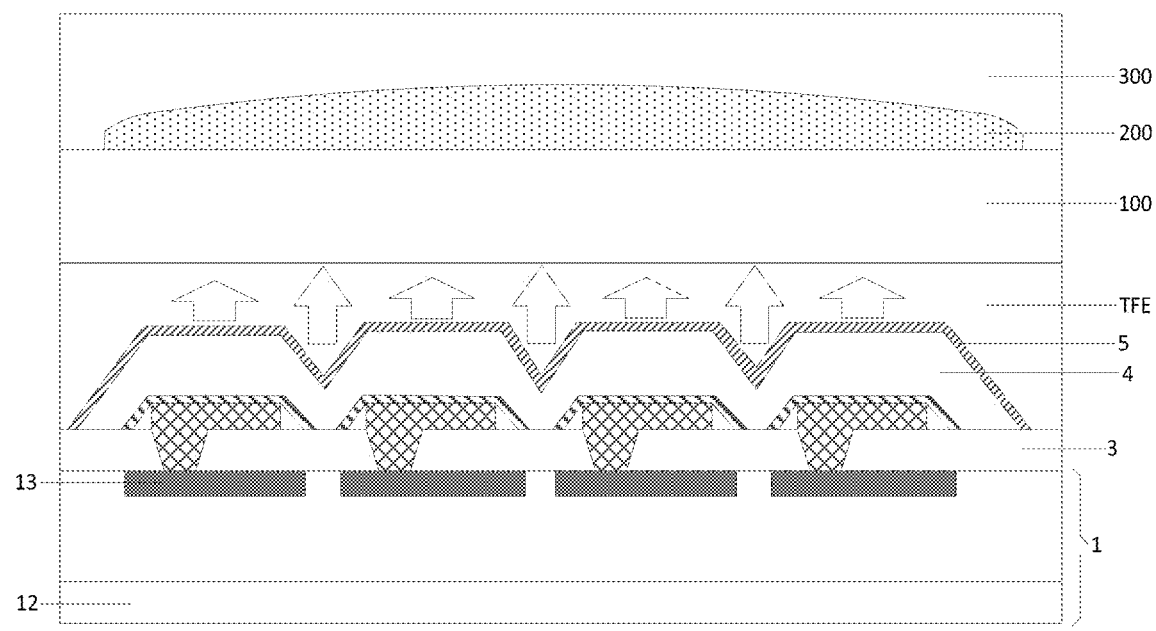
FIG. 16 is a schematic structural diagram of a display apparatus provided by an embodiment of the present disclosure.

For a product with a 3D display function, according to different display principles, the naked eye 3D technology can be divided into grating type naked eye 3D technology and cylindrical lens 3D display technology. As shown in FIG. 16, FIG. 16 is a schematic structural diagram of the display apparatus taking the cylindrical lens 3D display technology as an example provided by the embodiment of the present disclosure. The display apparatus includes the above display panel as well as a circular polarizer 100, a cylindrical lens array 200 and a protective layer 300 which are arranged in a stacked manner in sequence on a side of an encapsulation layer TFE of the display panel facing away from a substrate. The principle of achieving the 3D display technology of the display apparatus is the same as the prior art, which is not detailed herein.

Embodiments of the present disclosure provide the display panel, the manufacturing method therefor and the display apparatus, the sub-pixel units (e.g., R/G/B sub-pixel units) are patterned into the plurality of sub-pixels again, such as the sub-pixels corresponding to the first electrodes, the first electrodes of the sub-pixels are connected with the different driving electrodes respectively, and therefore display of each sub-pixel is independently driven. In combination with the grating type naked eye 3D technology or cylindrical lens 3D display technology or the like, the display panel provided by the present disclosure can realize high-resolution naked eye 3D displaying, and achieve high-definition displaying. Further, the top conductive layers of the first electrodes are arranged to be the sloping surface structures extending towards one side of the substrate, so that continuous light emitting of the sub-pixels in the sub-pixel units can be achieved, and generation of moires is avoided.

Although the preferred embodiments of the present disclosure have been described, those skilled in the art can make additional changes and modifications on these embodiments once they know the basic creative concept. So the appended claims are intended to be construed to include the preferred embodiments and all changes and modifications that fall into the scope of the present disclosure.

Apparently, those skilled in the art can make various modifications and variations to the embodiments of the present disclosure without departing from the spirit and scope of the embodiments of the present disclosure. In this way, under the condition that these modifications and variations to the embodiments of the present disclosure fall within the scope of the claims of the present disclosure and their equivalent technologies, the present disclosure is also intended to include these modifications and variations.

What is claimed is:

1. A display panel, comprising:
a substrate, comprising a plurality of sub-pixel units;
wherein each of the plurality of sub-pixel units comprises at least two first electrodes which are independently arranged in a same layer;
each first electrode comprises at least two conductive layers which are arranged in a stacked manner;
an edge of a top conductive layer away from the substrate extends beyond an edge of a bottom conductive layer;
an orthographic projection of the bottom conductive layer on the substrate falls within a range of an orthographic projection of the top conductive layer on the substrate; and
a portion of the edge of the top conductive layer extending beyond the edge of the bottom conductive layer extends towards one side of the substrate to constitute a sloping surface;
wherein each of the plurality of sub-pixel units further comprises an organic functional layer arranged on a side of the first electrodes facing away from the substrate;
the organic functional layer comprises a light emitting layer and a light emitting crosstalk layer arranged between the first electrodes and the light emitting layer;
the light emitting crosstalk layer is a P-type doping layer; and
light emitting crosstalk layers in each of the plurality of the sub-pixel units are independent of each other, and light emitting layers in each of the plurality of the sub-pixel units are independent of each other;
wherein in a direction facing away from the substrate, the organic functional layer further comprises a hole injection layer, a hole transmission layer and an electron blocking layer arranged in a stacked manner between the first electrodes and the light emitting layer; and
hole injection layers in each of the plurality of the sub-pixel units are of an integrated structure, hole transmission layers in each of the plurality of the sub-pixel units are of an integrated structure, electron blocking layers in each of the plurality of the sub-pixel units are independent of each other, and the light emitting crosstalk layer is arranged between the electron blocking layers and the hole transmission layers;
wherein the organic functional layer further comprises a hole blocking layer, an electron transmission layer and an electron injection layer arranged in a stacked manner in sequence on a side of the light emitting layer facing away from the substrate;
hole blocking layers in each of the plurality of the sub-pixel units are of an integrated structure, electron transmission layers in each of the plurality of the sub-pixel units are of an integrated structure, and electron injection layers in each of the plurality of the sub-pixel units are independent of each other; and
the electron injection layer is a N-type doping layer.

2. The display panel according to claim 1, wherein each first electrode comprises two conductive layers arranged in a stacked manner;
a material of the top conductive layer comprises one or a combination of ITO, IZO, IGZO, TiN or Mo; and
a material of the bottom conductive layer comprises one or a combination of Al, AlNd, Mo, Ti or TiN.

3. The display panel according to claim 1, wherein a slope angle of the sloping surface is smaller than 60°.

4. The display panel according to claim 1, wherein a length of the sloping surface of the portion of the edge of the top conductive layer extending beyond the edge of the bottom conductive layer ranges from 0.2 µm to 0.6 µm.

5. The display panel according to claim 1, wherein a distance between adjacent first electrodes is smaller than or equal to 2.5 µm.

6. The display panel according to claim 1, wherein a thickness of the light emitting crosstalk layer ranges from 600 angstroms to 1,200 angstroms; and
a doping concentration of a P-type doping material in the light emitting crosstalk layer is smaller than or equal to 5%.

7. The display panel according to claim 6, wherein the thickness of the light emitting crosstalk layer ranges from 900 angstroms to 1,000 angstroms; and
the doping concentration of the P-type doping material in the light emitting crosstalk layer ranges from 3% to 5%.

8. The display panel according to claim 1, further comprising:

a planarization layer arranged between the substrate and the first electrodes;

a cathode, a coupling light emitting layer and an encapsulation layer arranged in a stacked manner in sequence on a side of the organic functional layers facing away from the substrate;

the first electrodes are anodes; and the substrate comprises a plurality of driving electrodes, and each of the first electrodes is electrically connected with each of the driving electrodes through a via hole penetrating through the planarization layer respectively.

9. A display apparatus, comprising the display panel according to claim 1.

10. The display apparatus according to claim 9, wherein each first electrode comprises two conductive layers arranged in a stacked manner;

a material of the top conductive layer comprises one or a combination of ITO, IZO, IGZO, TiN or Mo; and and a material of the bottom conductive layer comprises one or a combination of Al, AlNd, Mo, Ti or TiN.

11. The display apparatus according to claim 9, wherein a slope angle of the sloping surface is smaller than 60°.

12. The display apparatus according to claim 9, wherein a length of the sloping surface of the portion of the edge of the top conductive layer extending beyond the edge of the bottom conductive layer ranges from 0.2 μm to 0.6 μm.

13. A manufacturing method of the display panel according to claim 1, comprising:

providing a substrate; and forming at least two first electrodes which are independently arranged in a same layer in each of a plurality of sub-pixel units in the substrate;

wherein each first electrode comprises at least two conductive layers which are arranged in a stacked manner, an edge of a top conductive layer away from the substrate extends beyond an edge of a bottom conductive layer, an orthographic projection of the bottom conductive layer on the substrate falls within a range of an orthographic projection of the top conductive layer on the substrate, a portion of the edge of the top conductive layer extending beyond the edge of the bottom conductive layer extends towards one side of the substrate to constitute a sloping surface, and the edge of the top conductive layer and a surface of the bottom conductive layer facing the substrate are on a same surface.

14. The manufacturing method according to claim 13, wherein the forming at least two first electrodes which are independently arranged in a same layer in each of a plurality of sub-pixel units in the substrate, comprises:

depositing a bottom conductive thin film on the substrate; wherein a material of the bottom conductive thin film comprises one or a combination of Al, AlNd, Mo, Ti or TiN;

depositing a top conductive thin film on a side of the bottom conductive thin film facing away from the substrate; wherein a material of the top conductive thin film comprises one or a combination of ITO, IZO, IGZO, TiN or Mo;

coating photoresist on a side, facing away from the substrate, of the top conductive thin film;

exposing and developing the photoresist;

etching off portions, with the photoresist removed, of the bottom conductive thin film and the top conductive thin film to form the top conductive layer;

wet-etching remaining bottom conductive thin film to form the bottom conductive layer, so as to make the edge of the top conductive layer extends beyond the edge of the bottom conductive layer;

peeling off remaining photoresist; and bombarding the top conductive layer by using plasma containing argon, oxygen and nitrogen to make the portion of the edge of the top conductive layer extending beyond the edge of the bottom conductive layer extend towards one side of the substrate to constitute the sloping surface.

\* \* \* \* \*